(12) United States Patent
Brewster et al.

(10) Patent No.: US 6,454,954 B1
(45) Date of Patent: Sep. 24, 2002

(54) DESMEAR ETCHANT AND USE THEREOF

(75) Inventors: Wanda Darlene Brewster, Tustin; Tuan Hoang Ho, Rancho Santa Margarita, both of CA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/575,515

(22) Filed: May 22, 2000

(51) Int. Cl.[7] .................................................. B44C 1/22
(52) U.S. Cl. ................. 216/7; 216/13; 216/17; 427/97; 427/98; 427/304; 427/534
(58) Field of Search .................... 427/97, 534, 304, 427/98; 205/159; 156/651; 216/7, 13, 17

(56) References Cited

U.S. PATENT DOCUMENTS

| | | | |
|---|---|---|---|
| 4,042,729 A | * 8/1977 | Polichette et al. | 437/304 |
| 4,425,380 A | * 1/1984 | Duffy et al. | 427/97 |
| 4,430,154 A | * 2/1984 | Stahl et al. | 156/651 |
| 4,601,784 A | 7/1986 | Krulik | |
| 4,820,548 A | 4/1989 | Courduvelis et al. | |
| 4,948,630 A | * 8/1990 | Courduvelis et al. | 427/98 |
| 5,019,229 A | 5/1991 | Grapentin et al. | |
| 5,648,125 A | * 7/1997 | Cane | 427/534 |

* cited by examiner

*Primary Examiner*—Randy Gulakowski
*Assistant Examiner*—Gentle E Winter
(74) *Attorney, Agent, or Firm*—S. Matthew Cairns; John J. Piskorski

(57) ABSTRACT

Disclosed are methods for replenishing adhesion promoting baths from an unstable state without discarding the bath. Methods of adhesion promoting substrates, such as printed wiring boards, using the replenished baths are also disclosed.

12 Claims, No Drawings

DESMEAR ETCHANT AND USE THEREOF

BACKGROUND OF THE INVENTION

This invention relates generally to desmear and etchant baths. In particular, this invention relates to new permanganate baths having improved desmear and surface roughening capabilities.

Hole forming operations in resin containing materials often result in the smearing of resin over the interior wall or barrel of the hole. This resin smear is primarily attributable to the generation or utilization of temperatures exceeding the melting point of a resinous component of the material during the hole forming process.

Where holes are drilled in epoxy impregnated fiber glass laminate materials, such as those employed to make printed circuit boards, friction of the drill bit against the material raises the temperature of the bit. Often, drill bit temperatures are generated which exceed the melting temperature of many resin systems. The drill bit thus picks up melted resin on its course through the material being drilled, and this melted accretion is smeared in the barrel of the hole. In laser drilling operations to contact interior conductors in organic insulating substrates, a similar resin accretion or smear can develop on the exposed conductor surface.

While the problem of resin smear on the hole walls may be ignored in some applications, it is at times imperative that it be removed such as in the manufacture of multilayer printed circuit boards. Multilayer printed circuit boards are used for a variety of electrical applications and provide the advantage of conservation of weight and space. A multilayer board is comprised of two or more circuit layers, each circuit layer separated from another by one or more layers of dielectric material. Circuit layers are formed by applying a copper layer onto a polymeric substrate. Printed circuits are then formed on the copper layers by techniques well known to the art, for example print and etch to define and produce the circuit traces—i.e., discrete circuit lines in a desired circuit pattern. Once the circuit patterns are formed, a stack is formed comprising multiple circuit layers separated from each other by a dielectric layer, typically a resin-containing material such as epoxy, epoxy/glass or polyimide. Once the stack is formed, it is subjected to heat and pressure to form the laminated multilayer circuit board. When such a multilayer circuit board is made, holes are formed in the resin-containing material which includes a plurality of parallel planar metallic conductors, with the hole perpendicular to, and communicating with, two or more parallel metallic conductors. It is often desired to metallize the hole walls in order to form a conductive path between two or more of the metallic conductors. In such instances, the resin smear must be removed from the edges of the hole through the metallic conductors if conductive contact between the metallized hole wall and the metallic conductors is to be achieved. Thus, when circuit board holes are drilled through a copper clad base plastic laminate or through a plastic laminate containing internal conductor planes such as in a multilayer circuit board, resin smear on the metallic surfaces exposed to the walls of the holes must be removed to achieve proper functioning of the metallized, or plated, through-holes.

Plated through-holes as described above are useful as electrical connections between printed circuits having metallic conductors on both sides of the plastic laminate or between two or more of the various planes and surface conductor layers in multilayer boards. The electrical and mechanical integrity required for this function can only be attained by insuring complete removal of resinous materials from the entire inner circumference of the portion of the metallic conductor exposed by the hole.

Numerous methods are known for removing resin smear. One approach is a mechanical one and involves channeling a dry or wet stream of abrasive particles through such holes. A similar method is the use of hydraulic pressure to force a thick slurry of abrasive material through the holes. However, these mechanical methods are generally slow and difficult to control and complete removal of smear in all holes in a given circuit board is difficult to achieve.

Typically, chemical methods are used to desmear holes formed during printed circuit board manufacture. For example, acids such as concentrated sulfuric acid (down to about 90 percent concentration) and chromic acid, have been used to remove smeared epoxy resin. The high acid concentration required is very hazardous and requires extraordinary precautions by operators. Such acid desmear also provides undesirably rough holes. In addition, the concentrated sulfuric acid rapidly absorbs water, which limits its useful life span and can cause variations in the immersion times required to desmear the holes. Chromic acid also presents toxicity and waste disposal problems.

The most common chemical resin desmear method uses permanganate, such as potassium or sodium permanganate. For example, U.S. Pat. No. 4,601,784 (Krulik) discloses desmear solutions containing an alkali metal hydroxide, sodium permanganate and from 0.1 to 3.0 moles per mole of permanganate ion of a co-cation selected from potassium, cesium, rubidium and mixtures thereof. The concentrations of sodium permanganate used require the presence of the co-cation. The amount of sodium permanganate used in the baths according to this patent is at least 70 grams per liter of solution.

U.S. Pat. No. 5,019,229 (Grapentin et al.) discloses a method of etching epoxy resin having a high backetching rate with a stable, strong basic alkaline permanganate etching solution which is stabilized by electrochemical anodal oxidation.

Conventional desmear baths typically require a ratio of active permanganate ion concentration to total manganese concentration (as both manganate and permanganate) of 0.6 or greater. When the active:total ratio falls below 0.6, delamination of the plated metal to the substrate may occur. Such failure manifests itself as loss of metal adhesion or blistering of the base dielectric material. When such baths are regenerated, i.e. when the active:total ratio is adjusted to 0.6 or greater, the bath still results in substrates showing delamination with some of the new, advanced dielectric materials. This situation does not hold true for most conventional laminates, i.e., FR4, FR5 and high Tg reinforced laminates.

Typically, conventional permanganate based desmear baths result in substrates having a highly irregular topology and induced stresses after plating. Thus, it is desirable to provide desmear and etching baths that are effective at removing resinous accretions without providing substrates having highly irregular topology or induced stresses after plating. It is further desirable to provide permanganate etching solutions that are stable and do not require electrochemical anodal oxidation. It is still further desired to provide permanganate based desmear baths that can be regenerated without showing delamination.

SUMMARY OF THE INVENTION

It has been surprisingly found that the alkaline permanganate baths of the present invention are very effective at removing resinous accretion, i.e. desmear, and providing surface roughening. It has been also surprisingly found that printed circuit boards that have been subjected to the alkaline permanganate baths of the present invention have higher peel strengths as compared to those subjected to conventional permanganate baths.

In one aspect, the present invention provides a composition including one or more permanganate ion sources, one or more hydroxide ion sources and water, wherein the hydroxide ion is present in an amount of from about 25 to about 85 g/L and wherein the composition has a total manganese ion concentration of from about 15 to about 70 g/L.

In a second aspect, the present invention provides a method for preparing a resinous substrate for subsequent metallization including the step of contacting the substrate with a composition including one or more permanganate ion sources, one or more hydroxide ion sources and water, wherein the hydroxide ion is present in an amount of from about 25 to about 85 g/L and wherein the composition has a total manganese ion concentration of from about 15 to about 70 g/L.

In a third aspect, the present invention provides a method for desmearing resin from the inside walls of holes formed in resinous substrates including the step of contacting the substrate with a composition including one or more permanganate ion sources, one or more hydroxide ion sources and water, wherein the hydroxide ion is present in an amount of from about 25 to about 85 g/L and wherein the composition has a total manganese ion concentration of from about 15 to about 70 g/L.

In a fourth aspect, the present invention provides a method for etching the surface of a resinous substrate including the step of contacting the substrate with a composition including one or more permanganate ion sources, one or more hydroxide ion sources and water, wherein the hydroxide ion is present in an amount of from about 25 to about 85 g/L and wherein the composition has a total manganese ion concentration of from about 15 to about 70 g/L.

In a fifth aspect, the present invention provides a method for preparing a composition including one or more permanganate ion sources, one or more hydroxide ion sources and water, wherein the hydroxide ion is present in an amount of from about 25 to about 85 g/L and wherein the composition has a total manganese ion concentration of from about 15 to about 70 g/L, including the steps of a) first combining water and an amount of the one or more hydroxide ion sources sufficient to provide a caustic composition of about 1.2 N or lower; b) combining the one or more permanganate ion sources with the caustic composition; and c) then adding the remaining amount of the one or more hydroxide ion sources.

In a sixth aspect, the present invention provides a method for providing substrates having improved peel strength including the step of contacting the substrates with a composition including one or more permanganate ion sources, one or more hydroxide ion sources and water, wherein the hydroxide ion is present in an amount of from about 25 to about 85 g/L and wherein the composition has a total manganese ion concentration of from about 15 to about 40 g/L.

In a seventh aspect, the present invention provides a composition including one or more permanganate ion sources, one or more hydroxide ion sources and water, wherein the hydroxide ion is present in an amount of from about 25 to about 85 g/L and wherein the composition has a total manganese ion concentration of from about 15 to about 70 g/L, wherein the composition is prepared by the steps including a) combining water and an amount of the one or more hydroxide ion sources sufficient to provide a caustic composition of 1.2 N or lower; b) combining the one or more permanganate ion sources with the caustic composition; and c) adding the remaining amount of the one or more hydroxide ion sources.

DETAILED DESCRIPTION OF THE INVENTION

As used throughout this specification, the following abbreviations shall have the following meanings, unless the context clearly indicates otherwise: g=gram; mg=milligram; mL=milliliter; L=liter; DI=deionized; ° C.=degrees Centigrade; ° F.=degrees Fahrenheit; psi=pounds per square inch; ppm=parts per million; N=normal; cm=centimeter; lbs/in= pounds per inch; and wt %=percent by weight.

The terms "printed circuit board" and "printed wiring board" are used interchangeably throughout this specification. All amounts are percent by weight and all ratios are by weight, unless otherwise noted. All numerical ranges are inclusive and are combinable.

In general, the desmear and etching baths of the present invention include one or more permanganate ion sources, one or more hydroxide ion sources and water. Any permanganate ion source that is at least partially water soluble or water dispersible may be used in the present invention. Suitable permanganate ion sources include, but are not limited to, alkali metal permanganates such as sodium permanganate and potassium permanganate. Mixtures of permanganate ion sources may be advantageously used in the present invention. The permanganate ion sources useful in the present invention are generally commercially available and may be used without further purification.

The permanganate ion sources are typically used in the compositions of the present invention in an amount such that the concentration of permanganate ion is from about 8 to about 35 g/L, based on the concentration of active permanganate ion in the composition. It is preferred that the amount of active permanganate ion is present in an amount of from about 10 to about 30 g/L. For example, when sodium permanganate is used, it is present in an amount of from about 20 to about 50 g/L. In general, the total manganese concentration as manganate and permanganate ions is in the range of from about 15 to about 70 g/L, preferably from about 15 to about 65 g/L, and more preferably from about 20 to about 50 g/L. Typically, the ratio of active permanganate ion concentration to total manganese concentration is 0.4 or greater, preferably 0.5 or greater, and more preferably 0.6 or greater.

Any alkali metal hydroxide or alkaline earth hydroxide may be used in the present invention as the hydroxide ion source. It is preferred that the hydroxide ion source is an alkali metal hydroxide. Suitable alkali metal hydroxides include lithium hydroxide, sodium hydroxide, potassium hydroxide, rubidium hydroxide, and cesium hydroxide. It is preferred that the hydroxide ion source is sodium hydroxide or potassium hydroxide. Mixtures of hydroxide ion sources may be advantageously used in the present invention. The hydroxide ion sources useful in the present invention are generally commercially available and may be used without further purification.

Typically, the hydroxide ion sources are used in the compositions of the present invention in an amount such that the concentration of hydroxide ion is from about 25 to about 85 g/L, based on the volume of the composition. Preferably, the hydroxide ion concentration is from about 25 to about 50 g/L, and more preferably from about 25 to about 40 g/L.

The amounts of both the permanganate ion sources and hydroxide ion sources refer to the amounts of such components present in solution for a given bath. Likewise, the amounts of permanganate ions and hydroxide ions refer to the amounts of such ions present in the compositions of the invention.

The compositions of the present invention are prepared by a) first combining water, such as DI water, and an amount of the one or more hydroxide ion sources sufficient to provide a caustic composition of about 1.2 N or lower; b) combining the one or more permanganate ion sources with the caustic composition; and c) then adding the remaining amount of the one or more hydroxide ion sources. The baths of the present invention are prepared by following steps a) to c) in order. If this order of steps is not followed, then a conventional desmear and etch bath is obtained. It is preferred that the caustic composition is about 1.2 N or lower prior to the step of adding the remaining amount of the one or more hydroxide ion sources. A particularly suitable caustic composition concentration range in step b) is from about 0.5 to about 1.2 N, and more particularly from about 0.8 to about 1.2 N. If the caustic concentration in step b) exceeds about 1.2 N, the resulting bath will generate excessive manganate ions and manganese dioxide upon standing and cannot be effectively regenerated. In general, the amount of remaining hydroxide ion source added in step c) is that amount sufficient to adjust the concentration of the caustic in the total composition in the range of from about 1.5 to about 2.0 N. The total caustic concentration in the composition may exceed 2 N and may be as high as about 4 N. When the bath is prepared as above, with the caustic composition having a concentration of about 1.2 N or lower, the loading capacity of the bath for surface area processed, measured by the rise in the level of manganate ions is almost twice that of conventional baths.

In the preparation of the compositions of the present invention, the one or more hydroxide ion sources may be added to the water in a solid form or as a concentrated solution. Likewise, the one or more permanganate ion sources may be combined with the caustic composition in a solid form or as a concentrated solution. Concentrated solutions may be preferable in some instances due to ease of handling or to help avoid problems of overheating the compositions of the invention.

Thus, the present invention provides compositions including one or more permanganate ion sources, one or more hydroxide ion sources and water, wherein the hydroxide ion is present in an amount of from about 25 to about 85 g/L and wherein the composition has a total manganese ion concentration of from about 15 to about 70 g/L, wherein the composition is prepared by the steps comprising a) first combining water and an amount of the one or more hydroxide ion sources sufficient to provide a caustic composition of 1.2 N or lower; b) combining the one or more permanganate ion sources with the caustic composition; and c) then adding the remaining amount of the one or more hydroxide ion sources. Such compositions may be regenerated by a variety of known means, such as chemical or electrochemical methods. A further advantage of these compositions is that they may be regenerated at any time. In contrast, conventional desmear and etch baths can only be regenerated while in use, i.e. upon standing for a period of time, the baths cannot easily be regenerated. The baths of the present invention may be regenerated while the bath is being run or upon standing. If such compositions are not prepared in the manner described above, the compositions generate excessive manganate and manganese dioxide upon standing and cannot be effectively regenerated.

The compositions of the present invention may optionally contain a surfactant. Such surfactants are useful in helping to wet the surface of the resinous substrate. Suitable surfactants include fluorate wetting agents. The choice of such surfactants and the useful amounts of such surfactants are well known to those skilled in the art.

Such optional surfactants may be added anytime during the preparation of the compositions or baths of the present invention. Preferably, the optional surfactants are added to the baths after the all of the remaining one or more hydroxide ion sources have been added, i.e. following step c) described above.

Once the baths containing the compositions of the present invention are prepared, they are typically heated. In general, the baths of the present invention are heated at a temperature of about 140° F. (60° C.) or greater and preferably about 150° F. (65° C.) or greater. An upper temperature for heating such baths is typically about 200° F. (93° C.). A particularly useful temperature range is from about 160° to about 180° F. During heating, a lid may be placed on the bath to reduce evaporation or water may be periodically added to maintain the level of the bath and the concentration ranges of the bath components. In an automatic line, level controllers may be used to maintain the water level of the bath.

The compositions of the present invention are useful in removing resin smear from resinous substrates. In particular, the present invention is useful to prepare resinous substrates for metallization, for desmearing resin from the inside walls of holes in resinous substrates, for hole cleaning processes for multilayer circuit boards and for etchback processes for circuit boards. It is preferred that the substrate is a printed wiring board. It is further preferred that the printed wiring board includes one or more layers including epoxy resin, glass/epoxy resin or polyimide resin.

Substrates containing resin smear may be processed by any conventional means using the compositions of the present invention. For example, in the manufacture of a printed wiring board ("PWB"), the following steps are typically employed:

1. The PWB is precleaned before etching with the compositions of the present invention. Such precleaning removes oils or dirt, helps uniformly wet the substrate surfaces, both resin and metal, and optionally softens the resin slightly when an organic solvent is used. This softening of the resin helps the permanganate attack of the resin.

2. The cleaned PWB is then rinsed to remove the cleaning solution.

3. The rinsed PWB is then contacted with the compositions of the present invention for a time sufficient to effect the desired resin removal. The actual conditions employed will vary with the type of etching desired, for example, desmearing may require only a short period of time while etchback may require a longer period of time. Suitable times for desmearing are from about 1 to about 10 minutes, while suitable times for etchback are from about 10 to about 60 minutes.

4. Following treatment with the compositions of the present invention, the PWB is thoroughly rinsed.

5. The rinsed PWB is then contacted with an acid neutralization solution, such as dilute sulfuric acid, to remove substantially all of the permanganate and manganese residues from the board.

6. After acid neutralization, the PWB is again rinsed. The PWB is then ready for subsequent metallization.

A further advantage of the present invention is that substrates, such as printed wiring boards, are obtained having increased peel strength as compared to boards processed using conventional desmear and etch baths. Such increased peel strengths are obtained when lower total permanganate ion concentrations are used, such as up to about 40 g/L. Thus, the present invention provides a method for providing substrates having improved peel strength including the step of contacting the substrates with a composition including one or more permanganate ion sources, one or more hydroxide ion sources and water, wherein the hydroxide ion is present in an amount of from about 25 to about 85 g/L and wherein the composition has a total manganese ion concentration of from about 15 to about 40 g/L. In addition to having increased peel strengths, such substrates are also effectively desmeared.

The compositions of the present invention are typically higher in hydroxide ion concentration and lower in permanganate ion concentration as compared to conventional permanganate desmear and etch baths. A further advantage of the present invention is that total process yields are improved as compared to processes using conventional desmear baths.

While the present invention has been described with respect to printed wiring boards processes, it will be appreciated by those skilled in the art that the present invention may also be applied to any resinous substrate.

The following examples are intended to illustrate further various aspects of the present invention, but are not intended to limit the scope of the invention in any aspect.

EXAMPLE 1

A bath was prepared by combining 200 g (or 40 g/L) sodium hydroxide and DI water, such that the concentration of the caustic was 1.0 N. To this was added 200 ml of a 10% by weight sodium permanganate solution in DI water, followed by the remainder of the sodium hydroxide (200 g), which was sufficient to provide a caustic concentration of 2.0 N. The bath was heated at 180° F. The ratio of active permanganate ion concentration to total manganese concentration was 0.7.

A printed wiring board substrate containing a non-glass reinforced epoxy resinous layer and holes in the board was placed in the bath for 20 minutes. The substrate was then removed and rinsed with DI water. The 60 degree gloss reading of this surface was less than 5. Subsequent peel values after metallization with a total of 1.0 mil of copper was 6.2 lbs/in (10.85 Newtons/cm)

EXAMPLE 2

A series of baths, Samples A to L, were prepared according to Example 1 except that the amounts of sodium permanganate and sodium hydroxide, bath temperatures and sample dwell times in the bath were varied. The amounts of sodium permanganate and sodium hydroxide, temperatures and dwell times used are reported in the following table. Conventional baths, comparatives C-1 and C-2, were prepared using Circuposit 3308 (available from Shipley Company, Marlborough, Mass.). Samples were processed in the baths as described in Example 1 and their peel strengths determined. The results are reported in the table.

| Sample | Bath Temperature (° C.) | Bath Dwell Time (min) | NaOH Concentration (N) | Total Manganese Concentration (g/L) | Peel Strength (lbs/in) |
|---|---|---|---|---|---|
| A | 60 | 10 | 0.4 | 21 | 0 |
| B | 60 | 20 | 2 | 21 | 2.6 |
| C | 60 | 20 | 0.4 | 63 | 0.5 |
| D | 60 | 10 | 2 | 42 | 2 |
| E | 71 | 20 | 0.4 | 21 | 2.2 |
| F | 71 | 15 | 1.2 | 42 | 2.2 |
| G | 71 | 15 | 2 | 42 | 2.8 |
| H | 71 | 10 | 2 | 63 | 4.1 |
| I | 82 | 20 | 0.4 | 42 | 3.4 |
| J | 82 | 10 | 0.4 | 63 | 3.4 |
| K | 82 | 15 | 2 | 21 | 5.7 |
| L | 82 | 20 | 2 | 63 | 6.1 |
| C-1 | 82 | 15 | 1.2 | 42 | 4.7 |
| C-2 | 82 | 15 | 1.2 | 42 | 4.6 |

Increasing the bath temperature at a given concentration of permanganate and hydroxide ions for the baths of the present invention results in increased peel strength. The above data clearly show that the baths of the present invention provide increased peel strengths as compared to conventional desmear baths.

EXAMPLE 3

A bath was prepared according to Example 1, except that the initial active permanganate ion concentration was 25.1 g/L and the hydroxide ion content was 35.7 g/L. The bath was continuously run until the active permanganate ion concentration was 3.7 g/L at the same hydroxide ion concentration, at which point the bath was considered fully depleted. The bath was then regenerated by adding sufficient sodium hypochlorite to provide an active permanganate ion concentration of 19.7 g/L. Substrates contacted with this bath after regeneration showed the same peel strengths after metallization as substrates treated with the bath prior to depletion.

These data clearly show that the baths of the present invention can be regenerated without loss of peel strength in subsequently metallized substrates.

EXAMPLE 4 (COMPARATIVE)

The bath of Example 1 was prepared using a different procedure. The bath was prepared by combining 400 g sodium hydroxide and DI water, such that the concentration of the caustic was 2.0 N. To this bath was added 200 mL of a 10% by weight solution of sodium permanganate. The bath was heated to 180° F. and used for processing.

A sample containing a non-glass reinforced epoxide resin surface on an FR4 substrate was used. The sample was placed in the bath for 20 minutes. The sample was then removed and rinsed with DI water. Subsequent metallization of the surface of the sample provided for 6.0 lbs/in of peel strength with 1.0 mils of copper. The same bath was used the following day and complete delamination of the epoxide resin from the FR4 substrate resulted. No peel strength values were obtainable. Examination of the bath indicated the permanganate concentration was 15 g/L, however, performance was compromised as evidenced by the delamination of the epoxide layer. Reevaluation of the bath on the second day showed the permanganate content to be 5 g/L. Attempts to regenerate with sodium hypochlorite were not successful in increasing the permanganate values.

These data clearly show that when the baths are not prepared according to the present invention, they cannot effectively be regenerated.

What is claimed is:

1. A method for preparing a composition consisting of one or more permanganate ion sources, one or more hydroxide ion sources and water, wherein the hydroxide ion is present in an amount of from about 25 to about 85 g/L and wherein the composition has a total manganese ion concentration of from about 15 to about 70 g/L, comprising the steps of a) first combining water and an amount of the one or more hydroxide ion sources sufficient to provide a caustic composition of about 1.2 N or lower; b) combining the one or more permanganate ion sources with the caustic composition; and c) then adding the remaining amount of the one or more hydroxide ion sources.

2. The method of claim 1 wherein the permanganate ion source comprises one or more alkali metal permanganates.

3. The method of claim 2 wherein the alkali metal permanganate comprises sodium permanganate, potassium permanganate or mixtures thereof.

4. The method of claim 1 wherein the hydroxide ion source comprises one or more alkali metal hydroxide or alkaline earth hydroxide.

5. The method of claim 4 wherein the alkali metal hydroxide comprises one or more of lithium hydroxide, sodium hydroxide, potassium hydroxide, rubidium hydroxide, or cesium hydroxide.

6. The method of claim 1 wherein the caustic composition is about 1.0 N or lower.

7. The method of claim 1 wherein the caustic composition is about 0.5 to about 1.2 N.

8. A method for providing substrates having improved peel strength comprising preparing a composition consisting of one or more permanganate ion sources and water, wherein the hydroxide ion is present in an amount from about 25 to about 85 g/L and wherein the composition has a total manganese ion concentration of from about 15 to about 70 g/L, comprising the steps of a) first combing water and an amount of one or more hydroxide ion sources sufficient to provide a caustic composition of about 1.2N or lower; b) combining the one or more permanganate ion sources with the caustic composition; and c) then adding the remaining amount of the one or more hydroxide ion sources; and contacting the substrates with the composition.

9. The method of claim 8, wherein the substrate is a printed wiring board.

10. A method for preparing a resinous substrate for subsequent metallization comprising preparing a composition consisting of one or more permanganate ion sources, one or more hydroxide ion sources and water, wherein the hydroxide ion is present in an amount of from about 25 to about 85 g/L and wherein the composition has a total manganese ion concentration of from about 15 to about 70 g/L, comprising the steps of a) first combining water and an amount of the one or more hydroxide ion sources sufficient to provide a caustic composition of about 1.2N or lower; b) combining the one or more permanganate ion sources with the caustic composition; and c) then adding the remaining amount of the one or more hydroxide ion sources; and contacting the substrate with the composition.

11. A method for desmearing resin from the inside wells of holes formed in resinous substrates comprising preparing a composition consisting of one or more permanganate ion sources, one or more hydroxide ion sources and water, wherein the hydroxide ion is present in an amount of from about 25 to about 85 g/L and wherein the composition has a total manganese ion concentration of from about 15 to about 70 g/L, comprising the steps of a) first combining water and an amount of the one or more hydroxide ion sources sufficient to provide a caustic composition of about 1.2N or lower; b) combining the one or more permanganate ion sources with the caustic composition; and c) then adding the remaining amount of the one or more hydroxide ion sources; and contacting the substrates with the composition.

12. A method for etching the surface of a resinous substrates comprising preparing a composition consisting of one or more permanganate ion sources, one or more hydroxide ion sources and water, wherein the hydroxide ion is present in an amount of from about 25 to about 85 g/L and wherein the composition has a total manganese ion concentration of from about 15 to about 70 g/L, comprising the steps of a) first combining water and an amount of the one or more hydroxide ion sources sufficient to provide a caustic composition of about 1.2N or lower; b) combining the one or more permanganate ion sources with the caustic composition; and c) then adding the remaining amount of the one or more hydroxide ion sources; and contacting the substrates with the composition.

* * * * *